United States Patent
Hanan

(10) Patent No.: US 10,578,669 B2
(45) Date of Patent: Mar. 3, 2020

(54) PORTABLE DEVICE FOR SOFT ERRORS TESTING

(71) Applicant: Deny Hanan, Hibat Zion (IL)

(72) Inventor: Deny Hanan, Hibat Zion (IL)

(73) Assignee: Deny Hanan, Hibat Zion (IL)

( * ) Notice: Subject to any disclaimer, the term of this patent is extended or adjusted under 35 U.S.C. 154(b) by 92 days.

(21) Appl. No.: 15/876,157

(22) Filed: Jan. 21, 2018

(65) Prior Publication Data

US 2019/0011495 A1  Jan. 10, 2019

Related U.S. Application Data

(60) Provisional application No. 62/530,308, filed on Jul. 10, 2017.

(51) Int. Cl.
*G01R 31/28* (2006.01)
*G01R 31/00* (2006.01)

(52) U.S. Cl.
CPC ....... *G01R 31/2881* (2013.01); *G01R 31/003* (2013.01); *G01R 31/2834* (2013.01); *G01R 31/2862* (2013.01); *G01R 31/2863* (2013.01); *G01R 31/2865* (2013.01); *G01R 31/2874* (2013.01)

(58) Field of Classification Search
CPC ............ G01R 31/31816; G01R 31/002; G01R 31/2881; G01R 31/318541;
(Continued)

(56) References Cited

U.S. PATENT DOCUMENTS

| | | | | | |
|---|---|---|---|---|---|
| 4,788,495 A | * | 11/1988 | Plies | .............. | G01R 31/305 |
| | | | | | 250/311 |
| 5,548,211 A | * | 8/1996 | Tujide | .............. | G01R 31/305 |
| | | | | | 324/754.22 |

(Continued)

FOREIGN PATENT DOCUMENTS

CN  101846725  9/2010

OTHER PUBLICATIONS

Evaluation of error detection schemes using fault injection by heavy-ion radiation, [1989] The Nineteenth International Symposium on Fault-Tolerant Computing. Digest of Papers, Jun. 21-23, 1989, pp. 340-347 Gunneflo et al.; Jun. 21, 1989 (Jun. 21, 1989).

*Primary Examiner* — Vinh P Nguyen
(74) *Attorney, Agent, or Firm* — Soroker Agmon Nordman

(57) ABSTRACT

An apparatus including a chamber is provided herein. The chamber includes: a radiation source; a load board slot configured for: (i) holding a load board; and (ii) connecting the load board to an automatic testing equipment. The chamber further includes at least one movable device for positioning the load board slot relative to the radiation source or positioning the radiation source relative to the load board slot; and a controller for receiving instructions and controlling the at least one movable device according to the received instructions. The chamber, including the automatic testing equipment, is configured for constructing and operating soft errors testing by positioning the load board slot, which holds a DUT (Device Under Test), relative to the radiation source or by positioning the radiation source relative to the load board slot, and counting the number of DUT datum errors, which are the soft errors.

20 Claims, 4 Drawing Sheets

(58) Field of Classification Search
CPC ........ G01R 31/318569; G01R 19/0061; G01R 29/24; G01R 31/2849; G01R 31/2856; G01R 31/303; G01R 31/318357; G01R 31/318533; G01R 31/318566; G01R 31/2817; G01R 31/2874; G01R 31/2865; G01R 31/2834; G01R 31/2862; G01R 31/2863; G06F 11/00; G06F 11/08; G06F 11/0787; G06F 11/0751; G06F 11/1016; G06F 11/1608; G06F 17/5022; G06F 11/1008; G06F 11/2215; G06F 2211/109; G06F 11/073; G06F 11/0793; G06F 11/261; H03K 19/17764; H03K 19/007; H03K 19/1731; G02F 1/133553; G02F 2001/133616; G02F 2001/133618; G02F 2201/44; G02F 2203/02; G05B 23/0286; H03M 13/09; H01L 21/322; H01L 21/324; H01L 27/10844; H01L 29/167
See application file for complete search history.

(56) References Cited

U.S. PATENT DOCUMENTS

| | | | |
|---|---|---|---|
| 6,344,750 B1* | 2/2002 | Lo | G01R 31/307 250/492.2 |
| 6,476,388 B1* | 11/2002 | Nakagaki | G01N 23/225 250/306 |
| 6,914,447 B2* | 7/2005 | Baumann | G21K 5/02 324/762.01 |
| 7,634,713 B1* | 12/2009 | Ngo | G01R 31/31816 714/718 |
| 7,702,978 B2* | 4/2010 | Lewis | G06F 11/1064 714/3 |
| 8,106,664 B2* | 1/2012 | Chang | G01R 31/002 324/501 |
| 9,291,660 B2* | 3/2016 | Paffrath | G01R 31/31816 |
| 10,191,099 B2* | 1/2019 | Lee | G01R 31/31816 |
| 2010/0001738 A1 | 1/2010 | Chang et al. | |
| 2017/0082682 A1 | 3/2017 | Lee et al. | |

* cited by examiner

PORTABLE DEVICE FOR SOFT ERRORS TESTING

FIELD OF THE INVENTION

The present disclosure generally relates to stress-test-driven qualification of integrated circuits, and more specifically to soft errors testing.

BACKGROUND

Soft errors testing is mainly used in the electronics and computer industry, such as Integrated Circuit (IC) or Micro Electro-Mechanical Systems (MEMS). A soft error is a type of error where a signal or datum is wrong but usually not assumed to imply breakage. After observing a soft error, usually there is no implication that the system is any less reliable than before. In some industries, this kind of error is named a Single Event Upset (SEU), Multiple-bit Upset (MBU), Single Event Functional Interrupts (SEFI), Single Event Transients (SET) despite the fact that usually single event error is not destructive, there is an event named Single Event Latch-up (SEL) which tends to destroy the device. SEL is also named Single Gate Rupture (SEGR) or Single Event Burnout (SEB). The consequences of the single event error may arise at IC level, such as microprocessors, semiconductor memories and transistors and/or at system level, such as System on Chip (SoC), System in Package (SiP) Multiply Die Package (MDP), Package on Package (PoP) or Die on Die (DoD) etc. Soft errors testing is commonly performed after the manufacture of the IC and/or the electronic device and before mass production. For example, a microchip is commonly approved before it is permanently installed in the circuit board. Currently, there is a limited number of labs who conduct soft errors testing. The limited number of labs causes loss of valuable time for the manufacturers of electronic equipment, due to shipping, complex setup and high lab expense rates.

Some known systems/methods are used for Software Errors Rate (SER) testing. However, most known SER testing methods require fair amount of financial investment. Additionally, most known methods for SER testing require testing by equipment located in research and/or designated facilities. Furthermore, most known SER testing methods require: (i) a dedicated setup that suits the Device Under Test (DUT) and the laboratories' instruments; and (ii) programming of a dedicated software that detects and counts the number of soft errors. These requirements usually call for the involvement of a team of engineers, which make the requirements hard to implement.

Additionally, in order to perform an SER testing, one may have to schedule a testing date in advance and ship the required tested devices and/or electrical circuits to the facility location. The waiting time for a scheduled testing date and the duration of the shipping exhaust valuable resources.

Furthermore, a dedicated compatible load board should be designed for the testing each time a specific device and/or electrical circuit needs to be tested, since the load boards are not compatible for different devices and/or electrical circuits and adjusted for the testing equipment located at each testing sight. With the growing demand for electronic devices worldwide, the number of electronic device manufacturers has increased along with the need for soft errors testing. The significance of soft errors testing is rising in the fields of autonomous devices and/or Internet of Things (TOT) in the automotive; avionics; telecommunication; military devices; aerospace medical and many other market segments. Therefore, a need for cost effective, easy to construct and operate, automatic soft errors testing device is required. There is also a need for a compatible device to save shipping costs and time as mentioned above.

SUMMARY

According to an aspect of some embodiments of the present invention, there is provided a system including an apparatus. The apparatus includes: a chamber, the chamber housing: a radiation source; a load board slot configured for: (i) holding a Load Board (LB); and (ii) connecting the load board to an Automatic Testing Equipment (ATE); at least one movable device for positioning the load board slot relative to the radiation source; and a controller for receiving instructions and controlling the at least one movable device according to the received instructions; wherein said chamber, connected to the automatic testing equipment, is configured to construct and operate one or more different soft errors testing by positioning the load board slot relative to the radiation source. Using the claimed apparatus to perform a soft errors testing by connecting an electronic device i.e. Device Under Testing (DUT) to the LB.

Optionally, the radiation source is able to emit particles from a group of radiation types consisting of alpha particles, gamma particles, high energy neutrons, low energy neutrons, thermal neutrons, cosmic radiation or any combination thereof.

Optionally, the chamber is portable. In some embodiments, the chamber may also be a standalone device and/or mounted on the ATE and/or external to the ATE.

Optionally, the load board is configured to be compatible for a variety of different devices.

Optionally, the apparatus includes a shutter for covering the radiation source and preventing the radiation flux from reaching the load board, the shutter is controllable by the controller to enable or disable radiation source emittance.

Optionally, the ATE is configured to communicate with the load board for testing the operation of an electronic device installed on the load board.

Optionally, the apparatus includes radiation detector, configured to detect radiation, emitted by the radiation source.

Optionally, the load board slot is configured to be compatible and to place a variety of load boards and a device installed on the load board at a location determined by the controller.

Optionally, the received instructions are according to a test program that operates the automatic testing equipment.

Optionally, the positioning is determined according to at least one of the following parameters: (i) a size of a tested device and/or (ii) the amount of radiation detected by the detector.

Optionally, the controller is configured to control the positioning of at least one of the radiation source and a tested device by positioning of the load board slot.

Optionally, the radiation source is placed in a radiation source container which is configured to move in a three-dimensional axis; wherein the radiation source container is configured to place the radiation source coupled/aligned with a tested device which is connected to the load board.

Optionally, the radiation source container is configured to expose only the tested device to radiation. Thus, avoids the exposure of the radiation to surrounding tools and/or humans.

Optionally, the apparatus includes a thermal chuck, configured to heat the chamber and/or DUT and/or LB up to the maximum operation temperature of the DUT, for example to more than 125 degrees Celsius. In some embodiments, mainly when testing industrial devices, the required temperature may be even higher than 150 degrees Celsius. The thermal chuck may be capable of heating and/or cooling the chamber. The cooling temperature may be lower than minus 40 degrees Celsius.

Optionally, the apparatus includes a vacuum pump, configured to remove gas/air from the chamber. Said vacuum pump may control the required vacuum required for the test, e.g. reduce gas pressure below atmospheric pressure.

Optionally, the apparatus includes a venting aperture, configured to insert gas/air into the chamber. The gas inserted to the chamber may be used to enable the required conditions for the test, e.g. increase gas pressure above atmospheric pressure.

Optionally, the controller is configured to control at least one of covering and uncovering of the radiation source, temperature, vacuum and venting aperture.

Optionally, the controller operates the ATE based on the level of radiation in the chamber. The controller may trigger the automatic testing equipment based on the conditions in the chamber and according the required condition and sequence.

Optionally, the positioning is during operation of the testing equipment. The controller controls the necessary relative distances between all components and sub components of the apparatus.

Optionally, the apparatus includes a pump for changing and/or controlling the gas pressure within the chamber,

BRIEF DESCRIPTION OF THE DRAWINGS

Some non-limiting exemplary embodiments or features of the disclosed subject matter are illustrated in the following drawings.

In the drawings.

Figure 1:
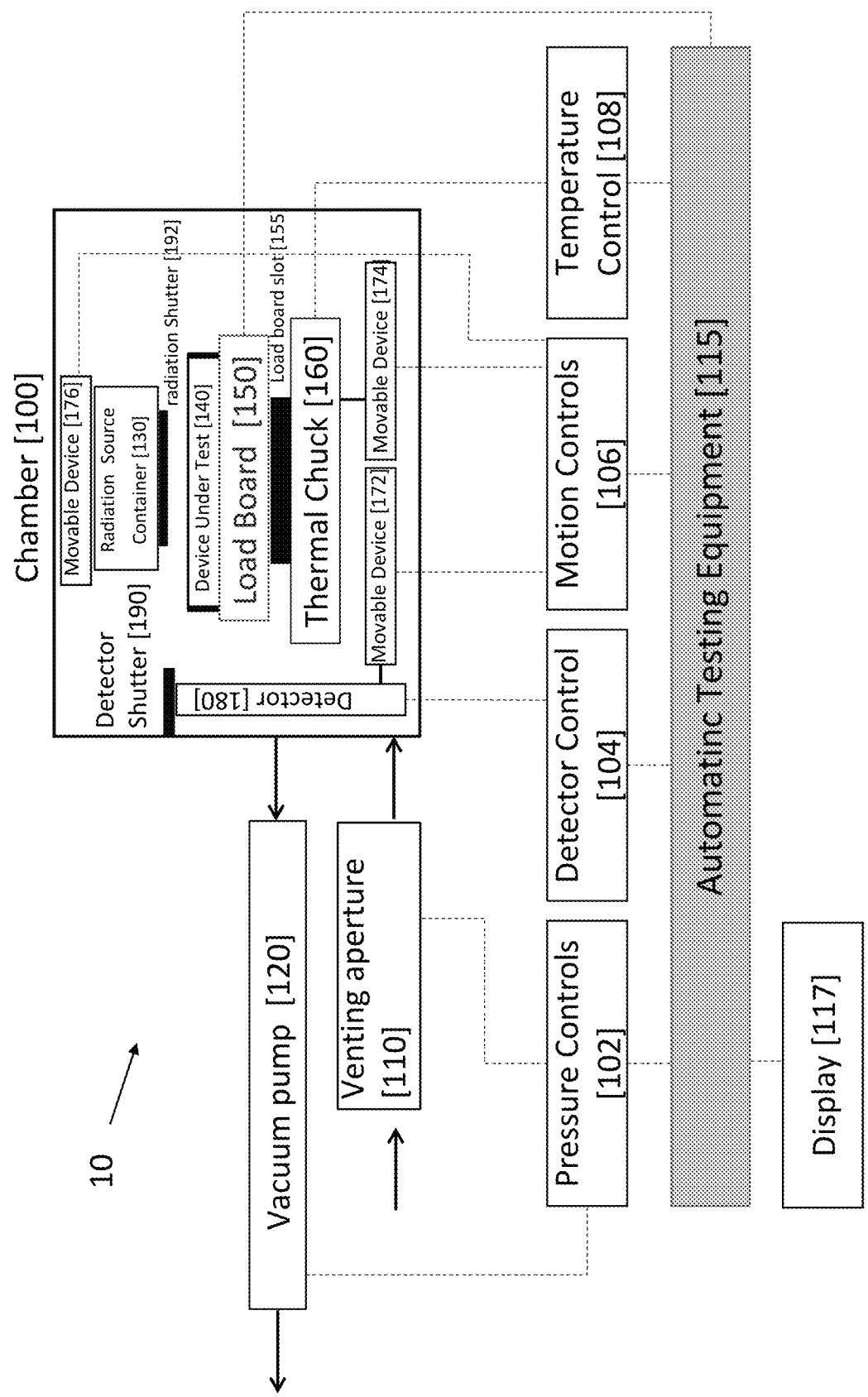
FIG. 1 is a schematic illustration of a system for soft errors testing of electronic devices and/or electrical circuits, according to some embodiments of the present invention.

With specific reference now to the drawings in detail, it is stressed that the particulars shown are by way of example and for purposes of illustrative discussion of some embodiments of the invention. In this regard, the description taken with the drawings makes apparent to those skilled in the art how embodiments of the invention may be practiced.

Identical or duplicate or equivalent or similar structures, elements, or parts that appear in one or more drawings are generally labeled with the same reference numeral, optionally with an additional letter or letters to distinguish between similar entities or variants of entities, and may not be repeatedly labeled and/or described. References to previously presented elements are implied without necessarily further citing the drawing or description in which they appear.

Dimensions of components and features shown in the figures are chosen for convenience or clarity of presentation and are not necessarily shown to scale or true perspective. For convenience or clarity, some elements or structures are not shown or shown only partially and/or with different perspective or from different point of views.

DETAILED DESCRIPTION

Some embodiments of the present invention provide an apparatus and a method for Soft Errors Rate (SER) testing. According to some embodiments of the present invention, a SER testing chamber described may be a standalone and/or portable device and may be compatible for a variety of different devices, Load Boards (LB) and/or different interfaces e.g. Automatic Testing Equipment (ATE).

In some embodiments, the LB may be configured to be compatible for a specific Integrated Circuit (IC) and/or a variety of ICs. Furthermore, the LB may be programmable for different devices.

As opposed to known methods, the provided system and/or method, according to some embodiments of the present invention, enables users to perform most known SER testing at their own facility under proper radiation regulation procedures. Furthermore, using the provided system and/or method, enable the users to preform SER testing using their own test platforms and/or test software and eliminate the need to ship the equipment and/or engineers away. By doing so, the disclosed system and/or method may save the shipping time from the manufacturers to dedicated labs in remote locations and may also save the waiting time for scheduled date thereon. Therefore, resources may be saved by using the disclosed system and method of a standalone, portable and/or mounted on the ATE and/or extension to the ATE device. It may also include using a dedicated LB and/or dedicated software programs.

According to some embodiments of the present invention, a solution for a local SER testing is provided by a testing chamber of a convenient size and weight for mobility. The chamber may be configured to contain a radiation source and various kinds of adapted load boards with required testing features for corresponding tested components. The provided system may enable an automatic adjustment or manual adjustment of the position of the LB and/or DUT relative to the radiation source and various parameters of the chamber such as temperature, pressure levels and/or motion of the LB and/or DUT. In some embodiments, when the at least one movable device positions a Load Board Slot (LBS) relative to the radiation source either the LB or the DUT may move and may be positioned accordingly.

According to some embodiments, the adjustment of the position may be performed, for assuring the coverage of radiation flux, i.e. amount of radiation and/or type of radiation exposure, reaching the DUT elements. In some embodiments the amount of radiation and/or type of radiation exposure, reaches all the element of the DUT. The DUT is activated under the flux of energetic particles. For example, according to a corresponding pre-programmed test procedure executed by the ATE, which may count the number of errors detected.

The pre-programmed ATE test procedure may be similar and/or identical to the standard test program used for the specific DUT, such as Final Test (FT) and/or SORT test method program, which may control the quality of the DUT. SORT program as used herein is a test method commonly implemented as part of the final IC manufacturing step. It selects and marks only the good ICs and identifies and segregates the ICs that do not meet the requirements as "not for use".

In some embodiments, once the test is over, a user may receive the results immediately, enabling the adjustment of the device's design, thus avoiding under or over engineering. By receiving the results immediately a user may also avoid retest the device, adjust the SER test program and/or make adjustments to test program for assuring the required quality during manufacturing of the device and/or test other devices.

As used herein, the term "radiation" may refer to emittance of energetic particles such as alpha particles, gamma particles, high energy neutrons, low energy neutrons, thermal neutrons, cosmic radiation, electromagnetic radiation and/or any combination thereof. For example, terrestrial radiation that may come from the environmental, internal structure material and/or surrounding martial.

Some embodiments of the present invention may include an apparatus, a system, a method, and/or a computer program product. The computer program product may include a tangible non-transitory computer readable storage medium (or media) having computer readable program instructions thereon for causing a processor to carry out aspects of the present invention. Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including any object oriented programming language and/or conventional procedural programming languages and/or the ATE's program code/s and/or the disclosed controller program codes.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Reference is now made to FIG. 1, which is a schematic illustration of a system 10 for preforming Soft Errors Rate (SER) testing, according to some embodiments of the present invention. System 10 includes a chamber 100 and an Automatic Testing Equipment (ATE) 115 which may communicate with pressure controls 102, a detector control 104, motion controls 106, a temperature control 108 and a Load Board (LB) 150. The ATE 115 may control (i) the pressure via pressure controls 102; (ii) a radiation detector, that may measure the radiation flux, via radiation control 104; (iii) a motion controls 106, which may control the relative motion of the subcomponents; (iv) a temperature control 108 which may control the required temperature and LB 150.

According to some embodiments, ATE 115 may execute a pre-programmed Testing Program (TP) that is compatible with a Device Under Test (DUT) 140 and with LB 150. DUT 140 may be installed on and/or connected to LB 150, which may be designed for enabling the testing of DUT 140. LB 150 may be placed in chamber 100 on a Load Board Slot (LBS) 155 connected to motion controls 106. LB 150 may include, operative electronic components required for operation and/or transmission of data from DUT 140 to ATE 115.

According to some embodiments, ATE 115 may be of any form of testing equipment that is used for testing of a DUT 140. It may be a tailored application and/or standard measuring equipment and/or dedicated testers for the IC industry.

According to some other embodiments, pressure controls 102 may regulate the gas pressure in chamber 100, for example, by using a venting aperture 110 to insert gas into the chamber 100 and/or a vacuum pump 120 to take out gas from the chamber 100. For example, depending on instructions received from the ATE 115 regarding the required testing pressure i.e. the required environment.

In some embodiments, after using the chamber 100 to preform SER testing, the chamber 100 may be ventilated and set to atmospheric pressure prior to removing or inserting the DUT 140 or any other component. The RSC 130 may also be pressure regulated and its pressure may be controlled before, during and/or after operation and/or exposure of the DUT 140 to radiation. The Vacuum pump 120, may use the surrounding gas, for example 'air', to evacuate the gas located inside the chamber 100, for assuring free space radiation path.

It should be noted that the main objective of the vacuum pump 120 is to create vacuum in the chamber 100 to reduce and/or minimize collisions of the air molecules with the radiation emitted molecules, maximizing the collisions between the emitted radiation molecules and the DUT 140.

According to some embodiments, the detector control 104 may be responsible for controlling the operation of the detector 180 and/or the detector shutter 190. For example, once the detector 180 is positioned in front of the radiation source 130, both detector shutter 190 and radiation shutter 192 may be lifted and/or opened, to allow measurement of the radiation flux, inside the chamber 100. For example, the detector 180 may measure the amount and/or density of alpha particles emitted form a radiation source located in the RSC 130. The data measured, with regards to the radiation flux, may be communicated back to the ATE 115 via one of the controllers, such as the detector control 104, and may be presented, for example by using a display 117.

In some embodiments of the present invention, radiation shutter 192 and/or detector shutter 190 may be a mechanical device that shuts, blocks and/or absorbs the radiation flux and/or an electronic device that enables and/or disables the radiation source. For example, radiation shutter 192, or detector shutter 190 may switch on and/or switch off a radiation accelerator and/or a generator. In some embodiments of the present invention, radiation shutter 192 and/or detector shutter 190 may include electronic control of radiation source. For example, a switch that may shut or turn on the radiation source emittance and/or allows direct or indirect flux measurements.

According to some embodiments, the temperature control 108 may regulate the temperature of the chamber 100, the LB 150 and/or the DUT 140 by using the thermal chuck 160, for example, by cooling the chamber 100 to less than minus 40 degrees Celsius and heating the chamber 100 to more than 125 degrees Celsius, depending on the required test temperature and/or testing environment. The thermal chuck 160 may be connected and/or interfaced to and/or with LBS 155, thus, controlling the temperature of the LB 150 and/or its environment.

In some embodiments, the temperature may be measured and controlled directly or indirectly at the surface and/or at any subcomponents surface of the thermal chuck 160 and/or at the surface of the DUT 140. For example, by cooling the DUT 140 to less than minus 40 degrees Celsius and heating the DUT 140 to more than 120 degrees Celsius, depending on the required test temperature and/or testing environment.

It should be noted that the LB 150 may be disconnected from LBS 155 and may be removed from chamber 100 to accommodate various DUT 140 types. The DUT 140 may be installed and/or connected to the LB 150 when the LB 150 is inside or outside the chamber 100. However, it may be more comfortable to connect at least one DUT 140 to the LB 150 after removing the LB 150 from LBS 155 and/or chamber 100. When LB 150 is removed from the chamber 100, it is possible to replace it with another designated LB 150, which is compatible for a specific DUT 140.

In some embodiments, the LB 150 may be connected to the ATE 115 and interfaced with other components via a LBS 155, which is configured to be compatible and accommodate a variety of LBs 150 and/or the device installed thereon.

In some other embodiments, the motion controls 106 may operate the movement of the detector 180, the LBS 155, and/or the container 130. For example, including the opening and/or closing of the detector shutter 190 and/or the radiation shutter 192. Motion controls 106 may operate the positioning of the detector 180, for example according to the TP, by a movable device 172 such as a motor, for example an electric motor, actuators and/or step-motor or any other devices of that sort.

It should be noted that the TP and consequently the positioning of the different devices, for example the positioning of the DUT 140, the positioning and/or size of the LB 150, the positioning of the container 130 and/or the positioning of the detector 180 may be determined according to the size of the DUT 140, the radiation source used and/or the amount of radiation detected by the detector 180. Furthermore, the motion control 106 may facilitate and assure that the radiation flux emitted, covers all elements of the DUT 140.

In some embodiments, the motion controls 106 may also control and position thermal chuck 160. By the positioning of the thermal chuck 160, the motion controls 106 are in fact positioning the LBS 155, which is used as a connector to the LB 150. The DUT 140 is connected to the LB 150, and therefore by controlling and positioning the thermal chuck 160, the motion controls 106 control and position the DUT 140 according to the SER TP.

In some embodiments, the control and position of the LBS 155 by the motion controls 106 may be performed by using a movable device 174, such as a motor. For example, an electric motor, actuators and/or step-motor or any other devices of that sort. Furthermore, the motion controls 106 may also be responsible for controlling and positioning the RSC 130 according to the SER TP using a movable device 176, such as a motor, for example an electric motor, actuators and/or step-motor or any other devices of that sort. The RSC 130 may facilitate various sources of radiation materials, source accelerator and/or source generator. For example, alpha particles source, such as a radioactive material, vacuum tube, cathode tube and/or accelerator may be placed into the container 130.

In some embodiments of the present invention, radiation shutter 192 acts, along with the container 130, as a cover to prevent an unwanted radiation flux from being released into the chamber 100. The ATE 115 via one of the controllers, such as the motion control 104, may control the state of the radiation shutter 192, for example open and/or close, e.g. by using motion device 176. Furthermore, the container 130 may be constructed in such a manner that when placed in line with a designated DUT 140, only the DUT 140 may be exposed to the radiation flux. For example, the ATE 115 may instruct the motion controls 106 to position the container 130 in line with the designated DUT 140, for example according to the TP. Upon opening of the radiation shutter 192, only the designated DUT 140 will be exposed to the radiation flux emitted by the radiation source that is located in the RSC 130. For example, the RSC 130 may be configured to expose only the DUT 140 to radiation and to avoid exposure of radiation to other elements such as tools and/or humans.

In some embodiments, the motion controls 106 may be configured to control the positioning of at least one of the radiation source and/or the DUT 140, by positioning the DUT 140 and/or LB 150 relative to the radiation source.

According to some embodiments, the ATE 115 may communicate with the DUT 140 and/or the LB 150. For example, receive and/or transmit data, via connection and communication capabilities of the LB 150 and/or the LBS 155.

According to another example, the ATE 115 may supply the required voltages for proper operation of the DUT 140, receive and/or transmit data, provide the stimulus for toggling the internal nodes of the device and receive the responsive output of the DUT 140, provide the required stimulus for writing memories and/or logic patterns, write and read memories datum, e.g. via connection and communication capabilities of the LB 150 and/or the LBS 155. In some other embodiments, the ATE 115 may be configured to communicate with the DUT 140 via the LB 150, for testing the operation of an electronic device installed on the LB 150.

In yet some other embodiments, the LB 150 comprises a socket configured to insert and/or connect the DUT 140 so it may interface the LB 150 with the ATE 115.

It should be noted that the LB 150 may be adjusted, prepared and/or replaced by a designated LB. For example, based on specific TP requirements, the DUT 140 requirements/needs and/or operator's needs and/or suggestions. The adjustments and preparations of the LB 150 may include, size adjustments, adding and/or removing/replacing electronic circuit wiring and/or adding and/or removing electronic connections.

Figure 2A:
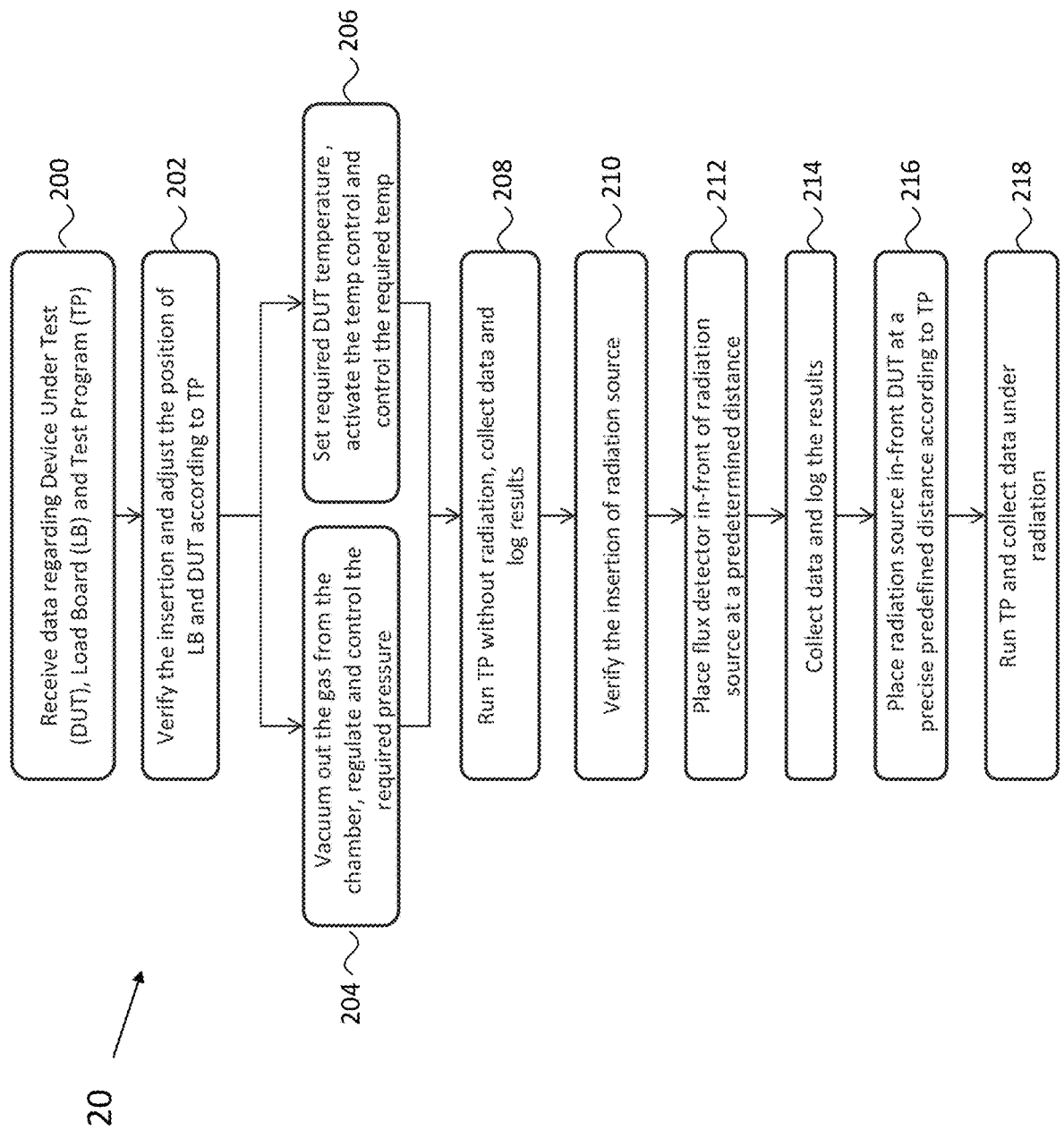
FIGS. 2A and 2B shows a schematic flowchart illustrating a method for soft errors testing of electronic devices and/or electrical circuits, according to some embodiments of the present invention.
Figure 2B:
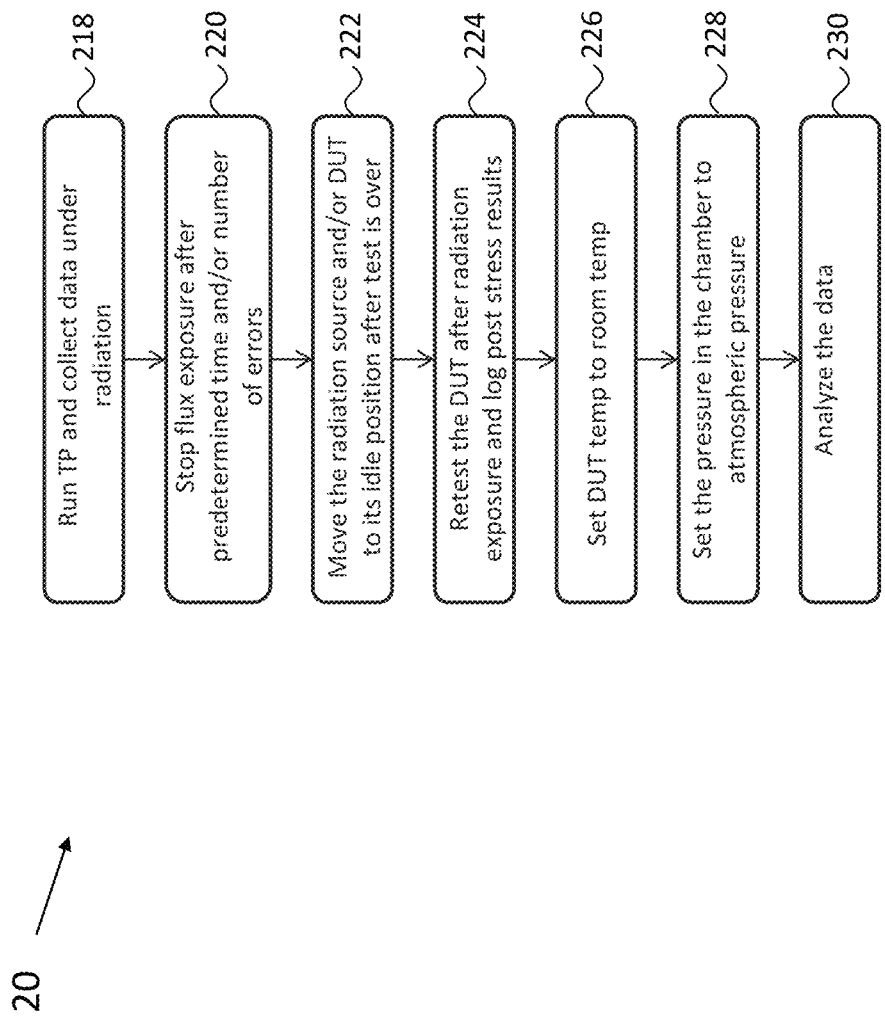

FIGS. 2A and 2B describe a method for soft errors testing, comprising one or more tests with or without an exposure to radiation, according to some embodiments. FIGS. 2A and 2B relate to elements presented in FIG. 1. As indicated in block 200, the ATE 115 may receive data regarding the DUT 140, the LB 150 and/or the TP. For example, the required ambient temperature and/or pressure that should be applied to chamber 100 and/or the duration of the test.

As indicated in block 202, the ATE 115 may verify that the required elements were inserted to chamber 100 and adjust the position according to the TP. An example for such verification and adjustment are when the ATE 115 verifies that the DUT 140, the LB 150 and/or RSC 130 are placed in their location and adjust their position, based on the instructions received from the TP. Additionally, based on the instructions received from the TP, the ATE 115 may instruct motion controls 106 to move the DUT 140 to the center of the chamber 100. After the verification and adjustment step the ATE 115 may also verify that there is a good communication connection between the DUT 140 to the ATE 115, so that data may be transmitted and/or received properly.

In some embodiments, the ATE 150 may instruct motion controls 106 to move RSC 130 to align the radiation source with the DUT 140 which is connected to the LB 150 which is connected to the LBS 155. As indicated in block 204, the ATE 115 may vacuum out the gas, e.g. air, from the chamber 100 to adjust the required pressure. For example, the ATE 115 may use the pressure controls 102 to regulate the required ambient pressure in the chamber 100, e.g. by using the vacuum pump 120 to remove gas, thus creating vacuum in the chamber 100, i.e. to reduce the pressure in the chamber 100 to be less than atmospheric pressure.

In some embodiments, the ATE 115 may use venting aperture 110 to insert gas into the chamber 100 to regulate and/or achieve the required pressure, e.g according to the TP. As indicated in block 206, the ATE 115 may set the required ambient temperature in chamber 100 by instructing the temperature control 108 to activate thermal chuck 160, for example by using thermal chuck 160 to heat up and/or cool down LB 150, DUT 140 and/or chamber 100, according to the TP.

In some embodiments, the test instructions are programmed and controlled via ATE 115. The received instructions are according to a test program that operates the device, which runs the required patterns and counts the number of errors that occurred during the test. The automatic testing equipment preforms the necessary stimulus for proper operation of the DUT and for counting the number of soft errors that occurred during the test.

As indicated in block 208, the ATE 115 may run the TP without exposing the DUT 140 to radiation, meaning, without opening radiation shutter 192 or before insertion of a radiation source into RSC 130. The ATE 115 may collect data, such as, counting the number of errors occurred during the test, and may log the data and present the results using display 117.

As indicated in block 210, the ATE 115 may verify, that radiation source was inserted into the RSC 130, according to the TP.

As indicated in block 212, the ATE 115 may place detector 180 in front of RSC 130 and/or at a predetermined distance for a predetermined time by instructing motion controls 106 to open detector shutter 190, or radiation shutter 192, as indicated in the TP. As indicated in block 214, the ATE 115 may collect and log the data received from detector 180 regarding the radiation flux, such as radiation flux values, and possibly present it using, a display 117.

As indicated in block 216, the ATE 115 may place RCS 130 by instructing the motion controls 106 to move RSC 130 and/or DUT 140. The RCS 130 is placed such that the radiation flux emitted from it is in front DUT 140 at a precise predefined distance and/or angle, according to the TP. For example, the ATE 115 may instruct motion controls 106 to place DUT 140 in line with and/or in a certain location relative to RSC 130 and/or radiation source, at a predefined distance and/or angle, for a predefined time according to the TP. The TP may instruct the motion control to move DUT 140 and/or radiation source in a path that exposes all the elements of DUT 140 to a predefined flux values.

In some embodiments, the ATE 115 may also verify that the radiation flux emitted may be according to the correct values specified in the TP and that there is proper communication with all subcomponents, for example, motion control, temp control and/or other controllers or devices participating in the texting procedure according to the TP.

As indicated in block 218, the ATE 115 may run the TP, while the DUT 140 is exposed to radiation. ATE 115 may collect data, for example count and log the number of errors occurred during the test, that may result from the exposure to the radiation flux flow emitted from the radiation source located in RSC 130 and may, present the results using display 117.

Reference is now made to FIG. 2B. As indicated in block 220, the ATE 115 may stop the exposure of the DUT 140 to the radiation originated from the radiation source located in RSC 130 after a predetermined time and/or the number of errors occurred. For example, the ATE 115 may instruct the motion controls 106 to close the radiation shutter 192, after a predetermined time period and/or number of errors that were detected by the ATE 115, according to the TP. As indicated in block 222, after the test is over, the ATE 115 may instruct the motion controls 106 to move the DUT 140 back to its idle position, by the motion device 176.

In some embodiments, as indicated in block 224, the ATE 115 may retest the DUT 140, without a direct exposure to radiation flux. For example, the ATE 115 may measure and/or count the number of errors occurred, during a post stress test, after the radiation flux had stopped, and may log and/or present the post stress results. When performing a test after radiation the ATE 115 may check for signs of single event latch-up that may damage the DUT 140.

As indicated in block 226, the ATE 115 may set the ambient temperature in the chamber 100 back to "room temperature" by instructing the temperature control 108, using the thermal chuck 160. As indicated in block 228, the ATE 115 may set the ambient pressure in the chamber 100 back to atmospheric pressure by instructing the pressure controls 102 to ventilate the chamber 100, using a venting aperture 110 and/or vacuum pump 120. The ATE 115 may also enable the opening of chamber 100 and the unloading of the DUT 140, e.g. separate DUT 140 from LB 150 and/or separate the LB 150 from the LBS 155.

In some embodiments, as indicated in block 230, the ATE 115 may analyze the data gathered during several tests. In the analysis, the ATE 115 may compare the number of errors detected under radiation flux to the number of errors detected before and/or after the exposure of the DUT 140 to radiation. The ATE 115 may also analyze the errors detected compared to the amount of radiation which were detected by detector 180, and/or the ambient temperature and/or pressure applied during the test. The ATE 115 may then present the data in a form of a report, using a display 117, data processing and/or report formation.

Figure 3:
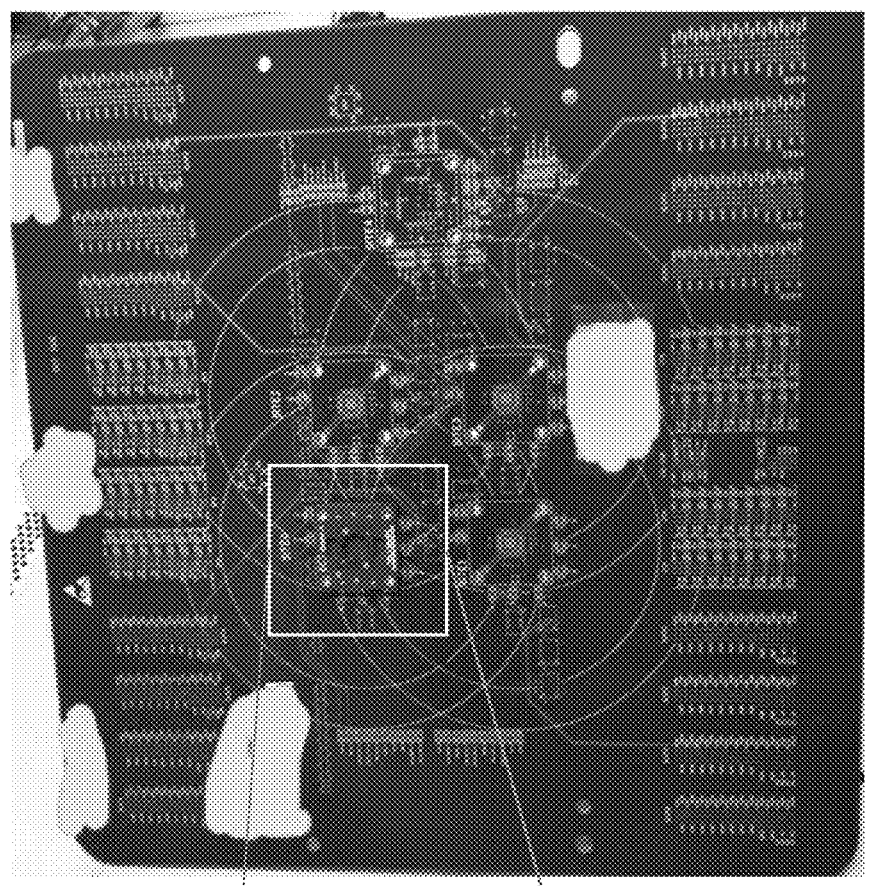
FIG. 3 is a photograph showing an illustration of a device under test connected to a load board, according to some embodiments of the present invention.
Figure 3:
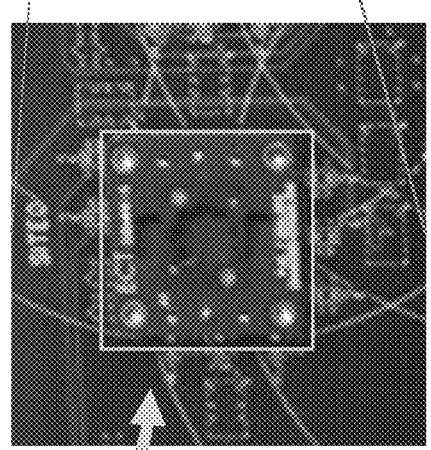

Turning now to FIG. 3, which relates to elements presented in FIG. 1. In FIG. 3 there is a photograph showing a commonly used LB 300 for an ATE 115, and an exemplary of LB 150. LB 150 is a circuit board, which is designed to serve as an interface circuit between the DUT 140 and the ATE 115. The photograph illustrates that the DUT 140 is placed on top of the LB 150 and is connected to it. In some embodiments, the LB 150 contains the necessary components to set up the DUT 140. For example, voltage, clocks, datum and stimulus. It should be noted that the LB 150 may be used by one DUT, as illustrated in FIG. 3 and/or by a plurality of DUTs and the LB 150 activates, operates and measures the DUT and/or the plurality of DUTs at the same time.

In some embodiments, LB 150 is adaptable and may be adjusted according to specific devices designated for testing. The dedicated LB 150 assures proper test functionality. LB 150 adjustments and preparations may include size adjustments, adding and/or removing/replacing electronic circuit wiring, adding and/or removing electronic connections and/or coating LB with different materials, such as ceramic isolators, according to the TP and/or DUT 140 requirements. As seen in FIG. 3, LB 150 may be smaller and more adjusted/adapted to specific requirements of DUT 140 than a commonly used LB 300. LB 150 may include only the components relevant to the testing of DUT 140 from LB 300.

In the context of some embodiments of the present disclosure, by way of example and without limiting, terms such as 'operating' or 'executing' imply also capabilities, such as 'operable' or 'executable', respectively.

Conjugated terms such as, by way of example, 'a thing property' implies a property of the thing, unless otherwise clearly evident from the context thereof.

The terms 'processor' or 'computer', or system thereof, are used herein as ordinary context of the art, such as a general purpose processor, or a portable device such as a smart phone or a tablet computer, or a micro-processor, or a RISC processor, or a DSP, possibly comprising additional elements such as memory or communication ports. Optionally or additionally, the terms 'processor' or 'computer' or derivatives thereof denote an apparatus that is capable of carrying out a provided or an incorporated program and/or is capable of controlling and/or accessing data storage apparatus and/or other apparatus such as input and output ports. The terms 'processor' or 'computer' denote also a plurality of processors or computers connected, and/or linked and/or otherwise communicating, possibly sharing one or more other resources such as a memory.

The terms 'software', 'program', 'software procedure' or 'procedure' or 'software code' or 'code' or 'application' may be used interchangeably according to the context thereof, and denote one or more instructions or directives or electronic circuitry for performing a sequence of operations that generally represent an algorithm and/or other process or method. The program is stored in or on a medium such as RAM, ROM, or disk, or embedded in a circuitry accessible and executable by an apparatus such as a processor or other circuitry. The processor and program may constitute the same apparatus, at least partially, such as an array of electronic gates, such as FPGA or ASIC, designed to perform a programmed sequence of operations, optionally comprising or linked with a processor or other circuitry.

The term 'configuring' and/or 'adapting' for an objective, or a variation thereof, implies using at least a software and/or electronic circuit and/or auxiliary apparatus designed and/or implemented and/or operable or operative to achieve the objective.

A device storing and/or comprising a program and/or data constitutes an article of manufacture. Unless otherwise specified, the program and/or data are stored in or on a non-transitory medium.

In case electrical or electronic equipment is disclosed it is assumed that an appropriate power supply is used for the operation thereof.

The flowchart and block diagrams illustrate architecture, functionality or an operation of possible implementations of systems, methods and computer program products according to various embodiments of the present disclosed subject matter. In this regard, each block in the flowchart or block diagrams may represent a module, segment, or portion of program code, which comprises one or more executable instructions for implementing the specified logical function(s). It should also be noted that, in some alternative implementations, illustrated or described operations may occur in a different order or in combination or as concurrent operations instead of sequential operations to achieve the same or equivalent effect.

The corresponding structures, materials, acts, and equivalents of all means or step plus function elements in the claims below are intended to include any structure, material, or act for performing the function in combination with other claimed elements as specifically claimed. As used herein, the singular forms "a", "an" and "the" are intended to include the plural forms as well, unless the context clearly indicates otherwise. It will be further understood that the terms "comprising", "including" and/or "having" and other conjugations of these terms, when used in this specification, specify the presence of stated features, integers, steps, operations, elements, and/or components, but do not preclude the presence or addition of one or more other features, integers, steps, operations, elements, components, and/or groups thereof.

The terminology used herein should not be understood as limiting, unless otherwise specified, and is for the purpose of describing particular embodiments only and is not intended to be limiting of the disclosed subject matter. While certain embodiments of the disclosed subject matter have been illustrated and described, it will be clear that the disclosure is not limited to the embodiments described herein. Numerous modifications, changes, variations, substitutions and equivalents are not precluded.

The invention claimed is:

1. A portable apparatus including:
    a chamber, the chamber comprising:
        a radiation source;
        a load board slot configured for: (i) holding a load board (LB) configured to hold a DUT (Device Under Test); and (ii) electrically connecting the load board to an automatic testing equipment;
        at least one movable device for positioning the load board slot relative to the radiation source; and
    a motion control for receiving instructions and controlling the at least one movable device according to the received instructions;
    wherein said chamber, connected to the automatic testing equipment, is configured to construct and operate one or more different soft errors testing of the DUT;
    wherein said soft errors testing comprises
        while selectively exposing the DUT to radiation;
        a) supplying said DUT with voltages for proper operation;
        b) receiving a response to said supplying as output from the DUT;
        c) counting errors in the responses.

2. The apparatus of claim 1, wherein the radiation source is able to emit particles from a group of radiation types consisting of alpha particles, gamma particles, high energy neutrons, low energy neutrons, thermal neutrons, cosmic radiation or any combination thereof.

3. The apparatus of claim 1, wherein the load board is configured to be compatible for a variety of different devices.

4. The apparatus of claim 1, comprising a shutter for covering the radiation source and preventing a radiation flux from the radiation source from reaching the load board, the shutter is controllable by the motion control to enable or disable radiation source emittance.

5. The apparatus of claim 1, wherein the automatic testing equipment is configured to communicate with the load board for testing the operation of an electronic device installed on the load board.

6. The apparatus of claim 1, comprising radiation detector, configured to detect radiation, emitted by the radiation source.

7. The apparatus of claim 1, wherein the load board slot is configured to be compatible and to place a variety of load boards at a location determined by the motion control.

8. The apparatus of claim 1, wherein the received instructions are according to a test program that operates the automatic testing equipment.

9. The apparatus of claim 1, wherein the motion control determines positioning of the load board slot relative to the radiation source according to at least one of the following parameters: (i) a size of a tested device and/or (ii) the amount of radiation detected by the detector.

10. The apparatus of claim 1, wherein the motion control is configured to control the positioning of at least one of the radiation source and a tested device by positioning of the load board slot.

11. The apparatus of claim 1, wherein the radiation source is placed in a radiation source container which is configured to move in a three-dimensional axis with respect to the DUT or the DUT is configured to move with respect to the radiation source container; wherein the radiation source container is configured to place the radiation source coupled/aligned with a tested device which is connected to the load board.

12. The apparatus of claim 11, wherein the radiation source container is configured to expose only a tested device to radiation while avoiding exposure of the radiation to surrounding tools and/or humans.

13. The apparatus of claim 1, comprising a thermal chuck, configured to heat or cool the chamber, DUT and/or LB.

14. The apparatus of claim 1, comprising a vacuum pump, configured to remove gas from the chamber thereby controlling pressure in the chamber.

15. The apparatus of claim 1, comprising a venting aperture, configured to insert gas into the chamber.

16. The apparatus of claim 1, wherein the apparatus further comprises a detector shutter configured to control operation of the shutter, a temperature control configured to control temperature of the chamber, and a pressure control configured to control pressure in the chamber by controlling operation of the vacuum pump or the venting aperture.

17. The apparatus of claim 1, wherein the motion control causes the automatic testing equipment to operate based on the level of radiation in the chamber.

18. The apparatus of claim 1, wherein the positioning is during operation of the testing equipment.

19. The apparatus of claim 1, comprising a pump for changing and/or controlling the gas pressure within the chamber.

20. The apparatus of claim 1, comprising a shutter for preventing a radiation flux from the radiation source from reaching the load board, said shutter is: (1) a mechanical device that shuts, blocks or absorbs the radiation flux, (2) an electronic device that enables or disables the radiation source, or (3) a device that switches on or switches off a radiation accelerator or a generator.

* * * * *